US010122103B2

(12) United States Patent
Endo et al.

(10) Patent No.: US 10,122,103 B2
(45) Date of Patent: Nov. 6, 2018

(54) BOARD CONNECTOR

(71) Applicant: DAI-ICHI SEIKO CO., LTD., Kyoto-shi, Kyoto (JP)

(72) Inventors: Takayoshi Endo, Shizuoka (JP); Yudai Baba, Shizuoka (JP)

(73) Assignee: DAI-ICHI SEIKO CO., LTD., Kyoto-Shi, Kyoto (JP)

( * ) Notice: Subject to any disclaimer, the term of this patent is extended or adjusted under 35 U.S.C. 154(b) by 0 days.

(21) Appl. No.: 15/785,172

(22) Filed: Oct. 16, 2017

(65) Prior Publication Data

US 2018/0123266 A1 May 3, 2018

(30) Foreign Application Priority Data

Oct. 28, 2016 (JP) ................................ 2016-212035

(51) Int. Cl.
*H01R 12/75* (2011.01)
*H01R 12/51* (2011.01)
(Continued)

(52) U.S. Cl.
CPC ......... *H01R 12/51* (2013.01); *H01R 12/7011* (2013.01); *H01R 12/7023* (2013.01); *H01R 13/46* (2013.01); *H01R 12/75* (2013.01)

(58) Field of Classification Search
CPC .............. H01R 12/7005; H01R 12/721; H01R 13/506; H01R 13/6275; H01R 12/724;
(Continued)

(56) References Cited

U.S. PATENT DOCUMENTS 3,501,736 A * 3/1970 Norris .................. H01R 13/436
439/353
3,811,154 A * 5/1974 Lindeman ............... F16B 21/02
174/138 D (Continued)

FOREIGN PATENT DOCUMENTS

GB 1375777 A 11/1974
JP H03-037764 U 4/1991

(Continued)

OTHER PUBLICATIONS

Extended European Search Report (Application No./Patent No. 17197676.4-1801); dated Dec. 8, 2017; 7 pages.

(Continued)

*Primary Examiner* — Truc Nguyen
(74) *Attorney, Agent, or Firm* — Howard & Howard Attorneys PLLC

(57) ABSTRACT

A board connector includes: an L-shaped pin terminal including an insertion inserted into a through hole in a printed board and a conductor swaging part extending in a direction (+Y-axis direction) orthogonal to the insertion; and a housing disposed on one main surface (flat face on the +Z side) of the printed board, the housing containing at least an end of the conductor swaging part and having an opening into which a cable connected to the conductor swaging part is inserted. The board connector further includes a J-shaped boss formed integrally with the housing, the boss passing through a through hole in the printed board and protruding from another main surface (flat face on the −Z side) of the printed board, extending in a direction (D2) (the +Y-axis direction) opposite to a direction toward the insertion, and further extending toward the printed board.

6 Claims, 21 Drawing Sheets

(51) Int. Cl.
*H01R 13/46* (2006.01)
*H01R 12/70* (2011.01)

(58) Field of Classification Search
CPC .. H01R 12/88; H01R 12/7029; H01R 12/714; H01R 13/629; H01R 13/6595; H01R 12/707; H01R 12/712; H01R 12/73; H01R 12/79
See application file for complete search history.

(56) References Cited

U.S. PATENT DOCUMENTS

| | | | | | |
|---|---|---|---|---|---|
| 4,589,794 | A * | 5/1986 | Sugiura | F16B 5/0614 | 174/138 G |
| 5,591,048 | A * | 1/1997 | Hahn | H01R 12/7005 | 439/567 |
| 5,893,776 | A * | 4/1999 | Black | H01R 9/24 | 439/532 |
| 5,984,722 | A * | 11/1999 | Ito | H01R 12/7064 | 439/557 |
| 6,280,246 | B1 * | 8/2001 | Sawayanagi | H05K 3/306 | 439/567 |
| 6,482,032 | B1 * | 11/2002 | Szu | H05K 3/306 | 439/567 |
| D488,777 | S * | 4/2004 | Ushiro | D13/133 | |
| 6,773,268 | B1 * | 8/2004 | Shipe | H05K 7/142 | 24/581.1 |
| 6,875,053 | B2 * | 4/2005 | Fujii | H01R 4/64 | 439/567 |
| 6,981,894 | B1 * | 1/2006 | Swantner | H01R 13/6275 | 439/567 |
| 7,226,304 | B1 * | 6/2007 | Ju | H05K 7/142 | 439/326 |
| 7,563,119 | B2 * | 7/2009 | Hsu | H05K 7/12 | 439/326 |
| 2004/0053529 | A1 * | 3/2004 | Kato | H05K 3/301 | 439/567 |

FOREIGN PATENT DOCUMENTS

| | | |
|---|---|---|
| JP | H08-007952 A | 1/1996 |
| JP | 3185668 B | 1/1998 |
| JP | 2000-067959 A | 3/2000 |
| JP | 2007-066575 | 3/2007 |
| JP | 2015-038810 A | 2/2015 |

OTHER PUBLICATIONS

Notification of Reasons for Refusal (JP Patent Application No. 2016-212035); Date of Drafting: Jun. 6, 2018; Includes English Translation.

* cited by examiner

FIG.7A1
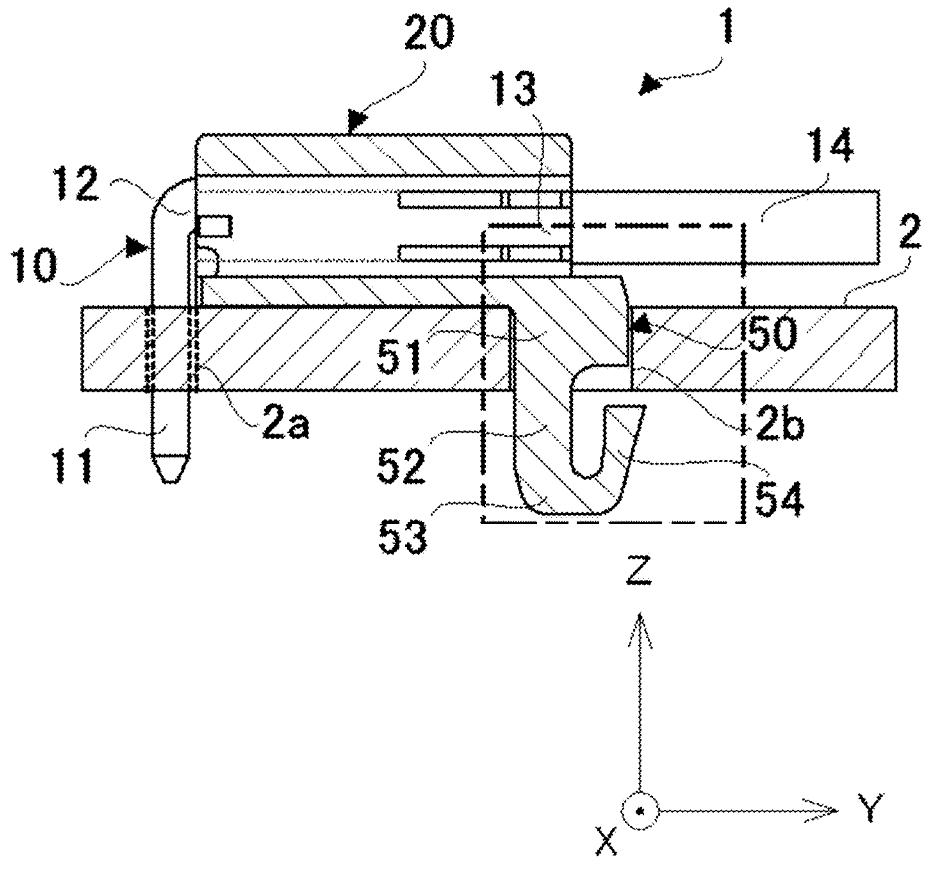

FIG.7A2
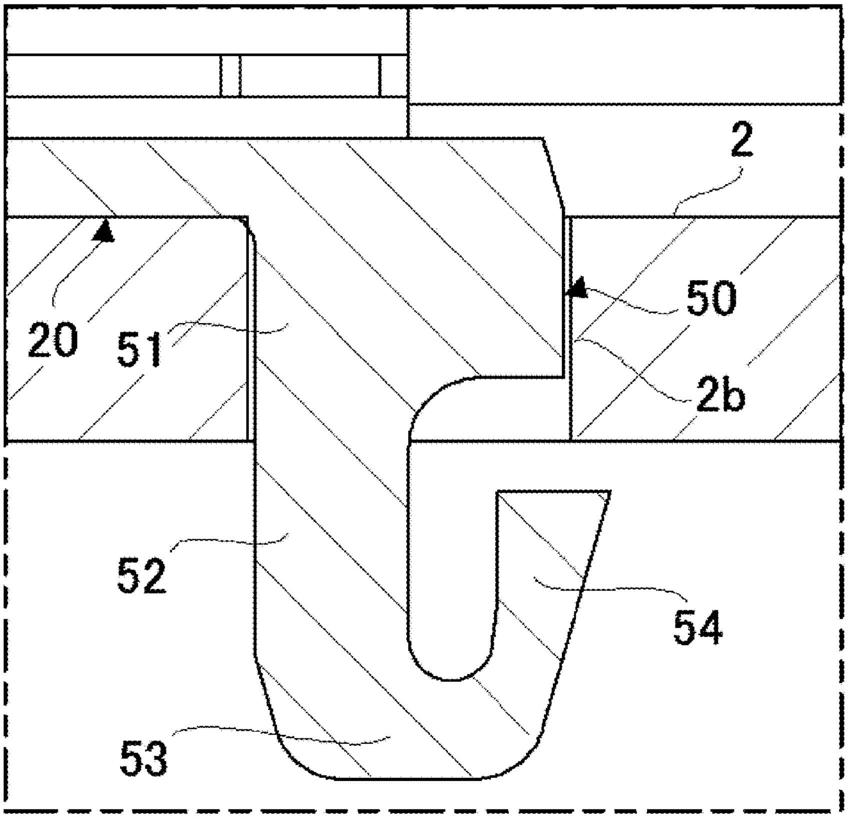

FIG.7B1
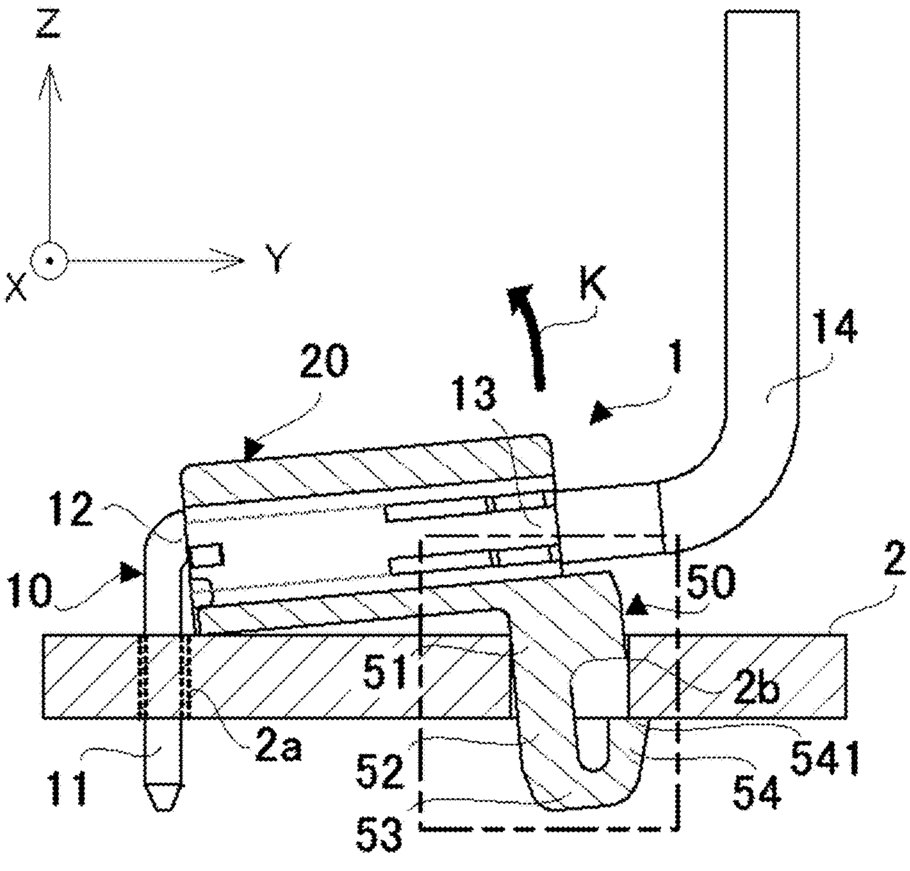

FIG.7B2
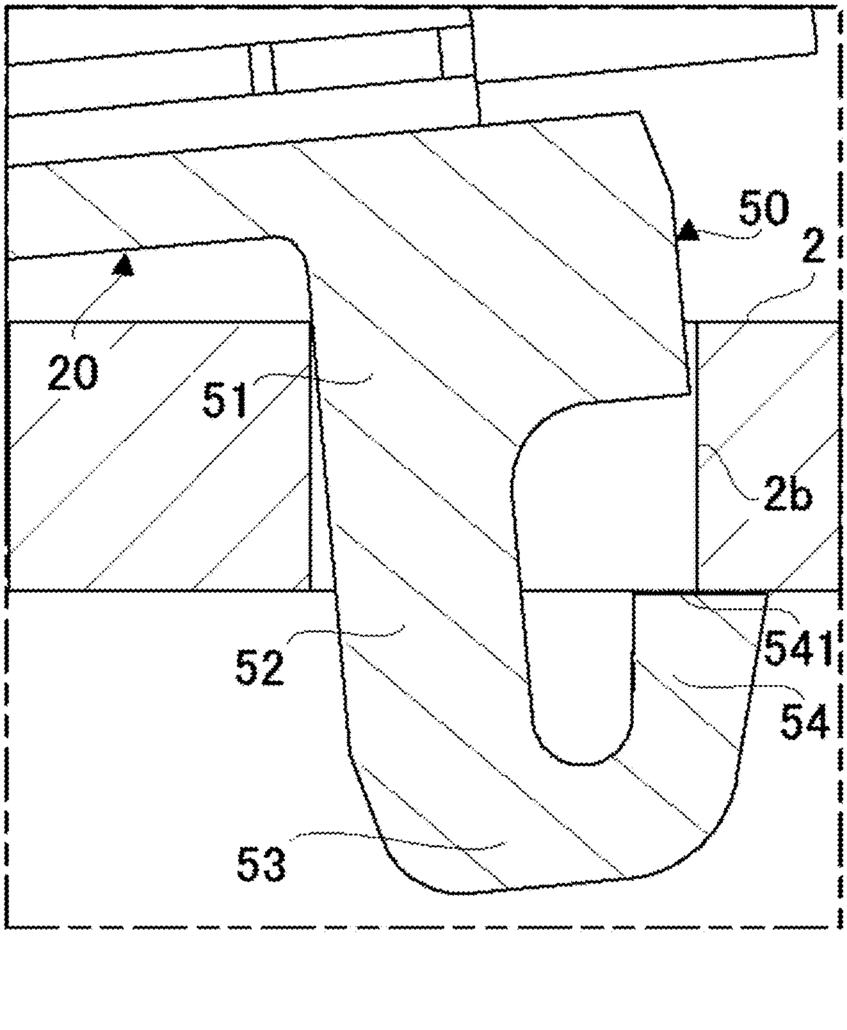

FIG.8A1
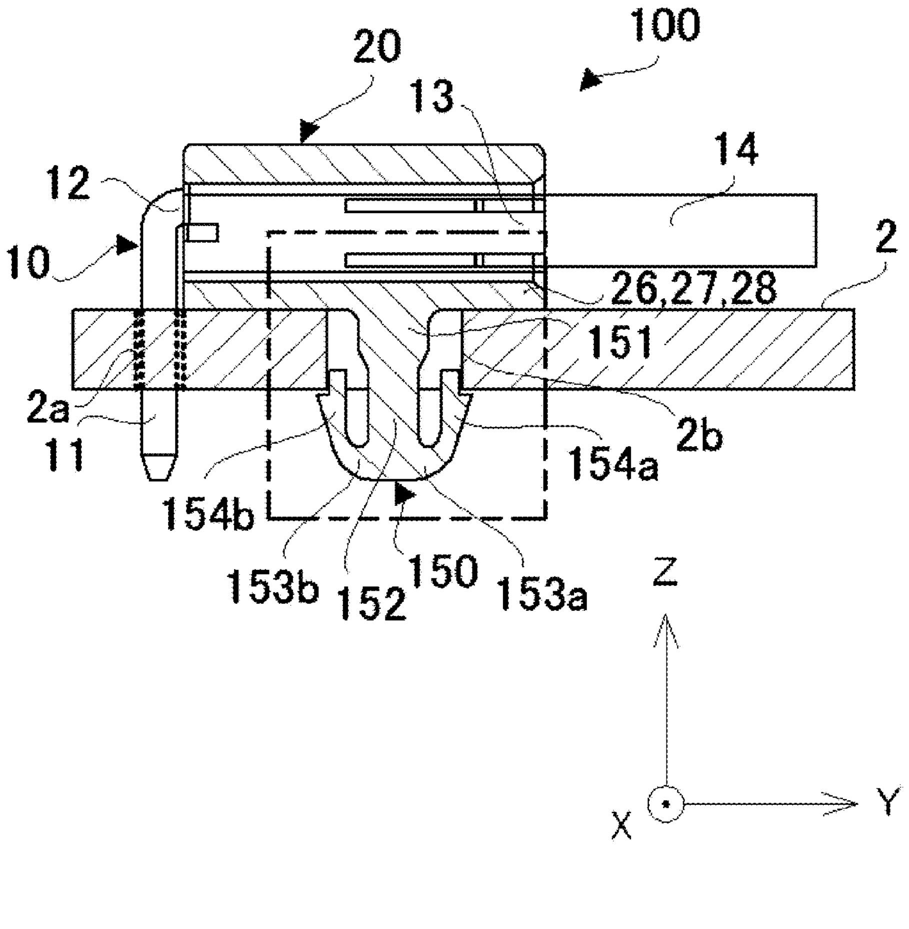

FIG.8A2
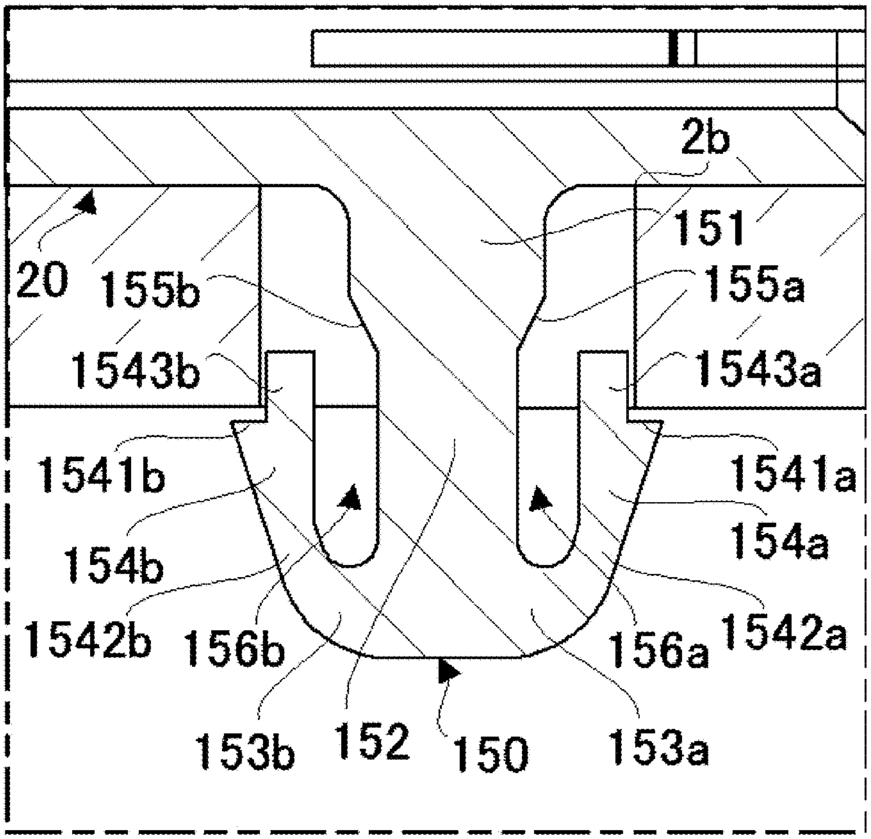

FIG.8B1
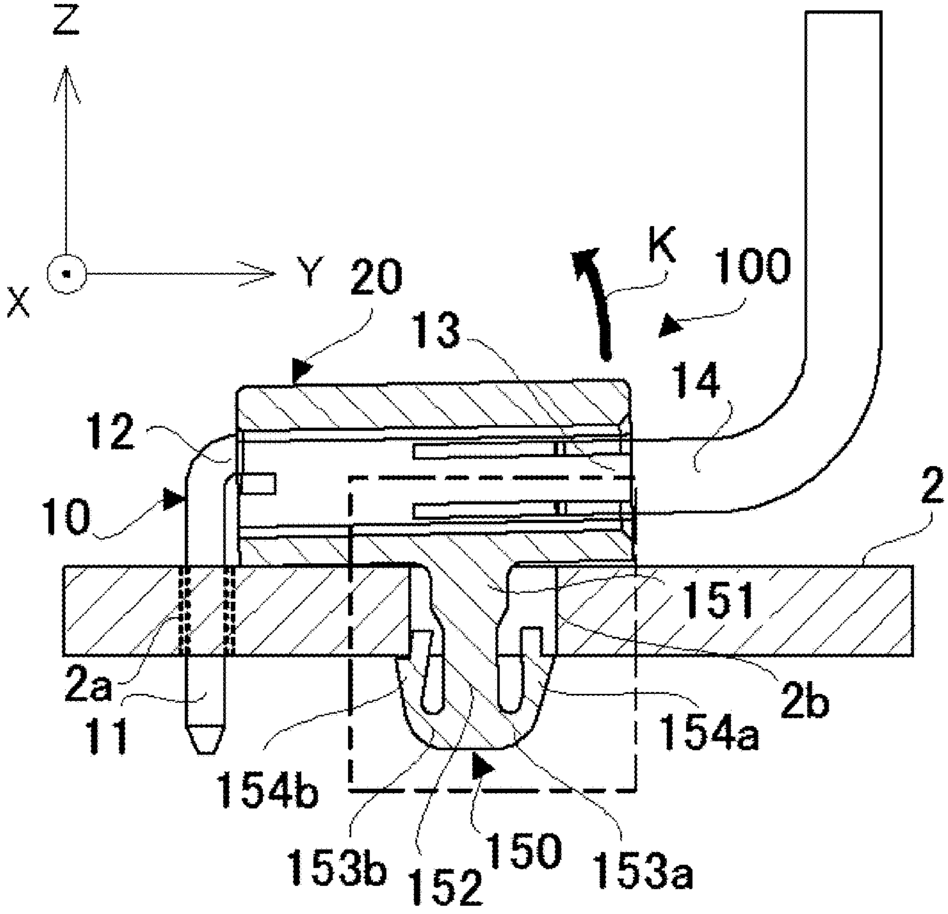

FIG.8B2
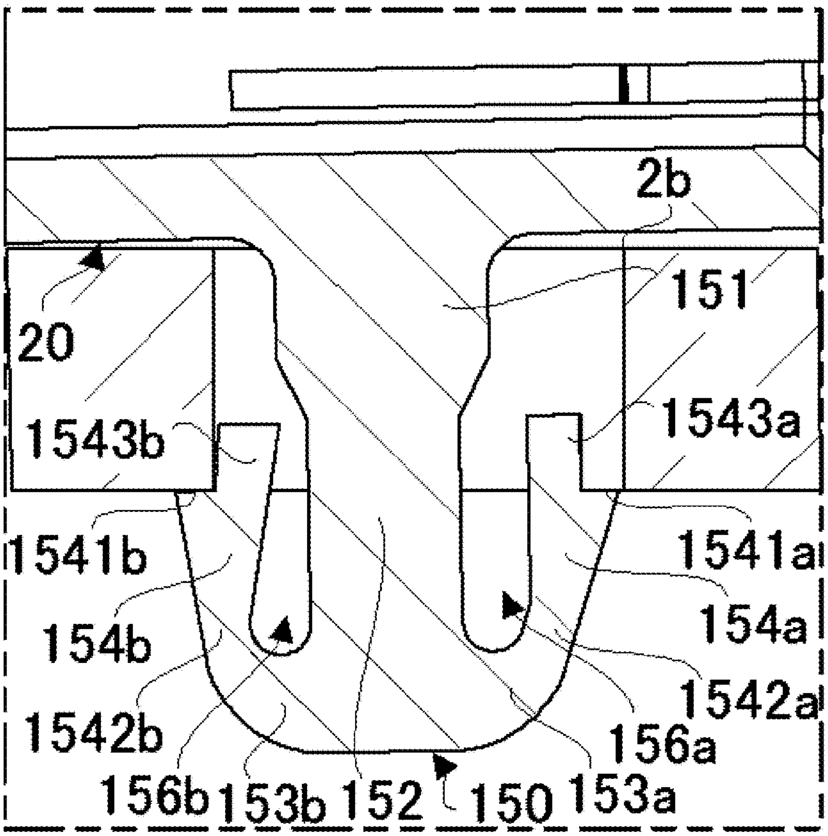

FIG.9A1
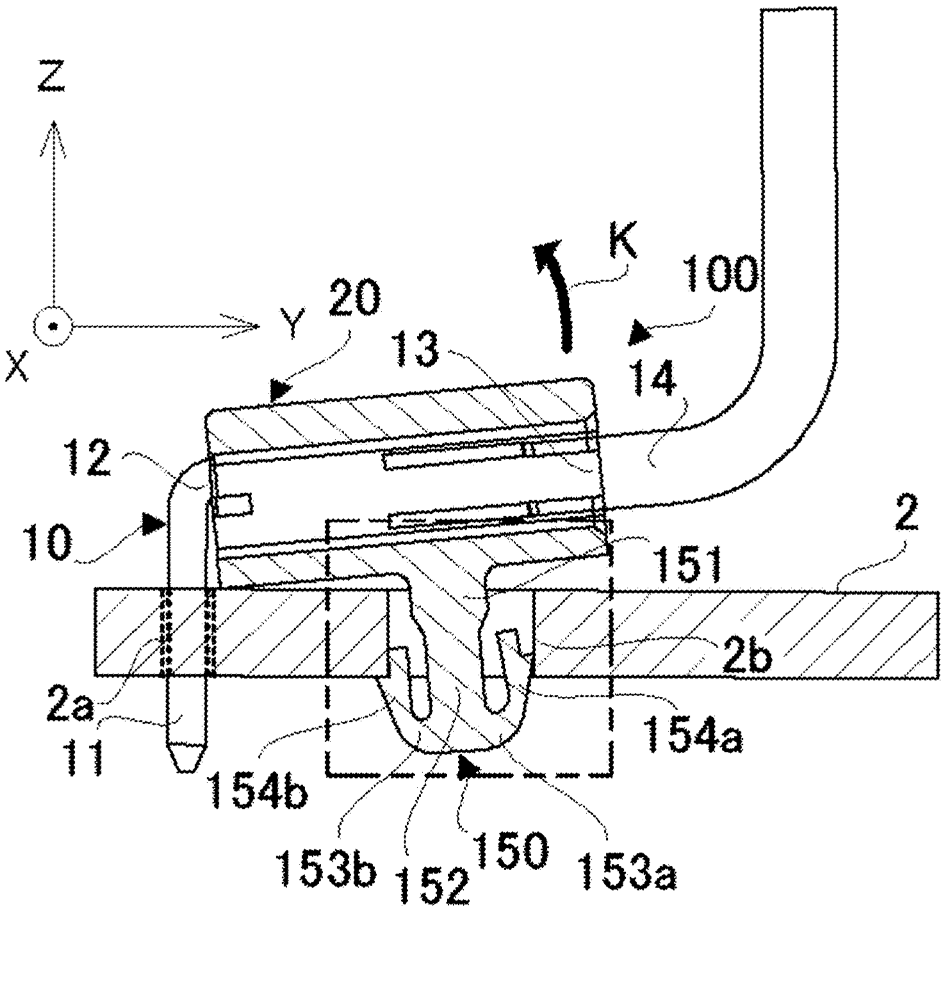

FIG.9A2
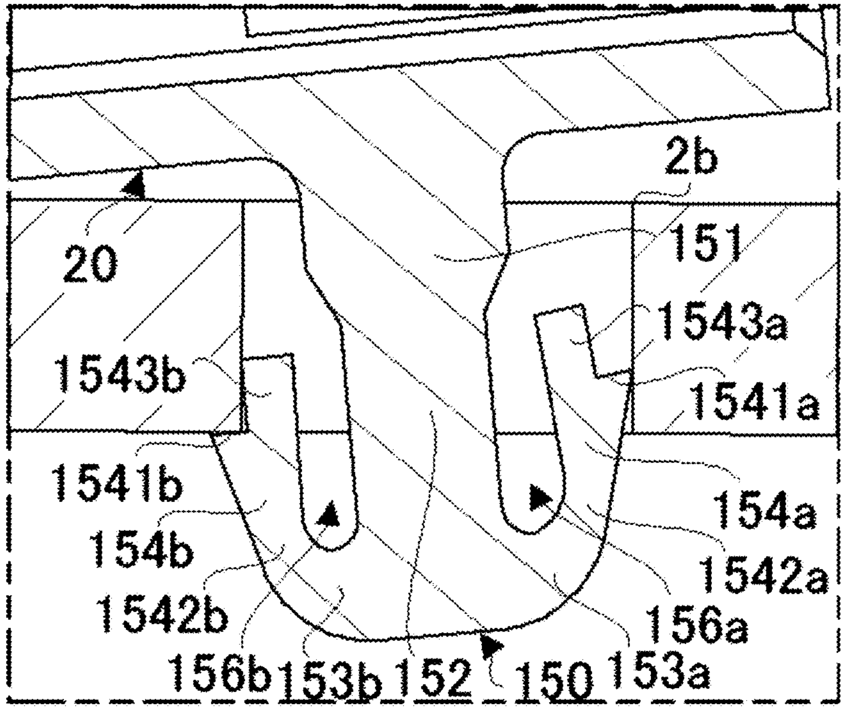

FIG.9B1
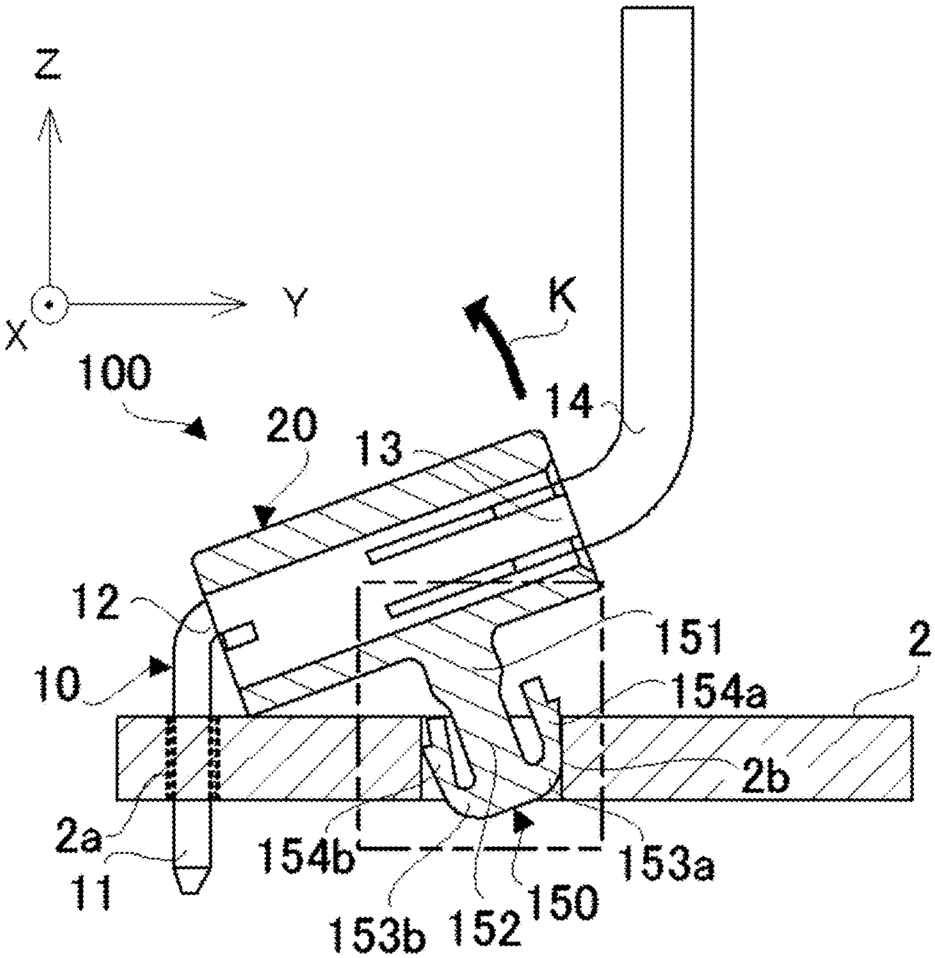

FIG.9B2
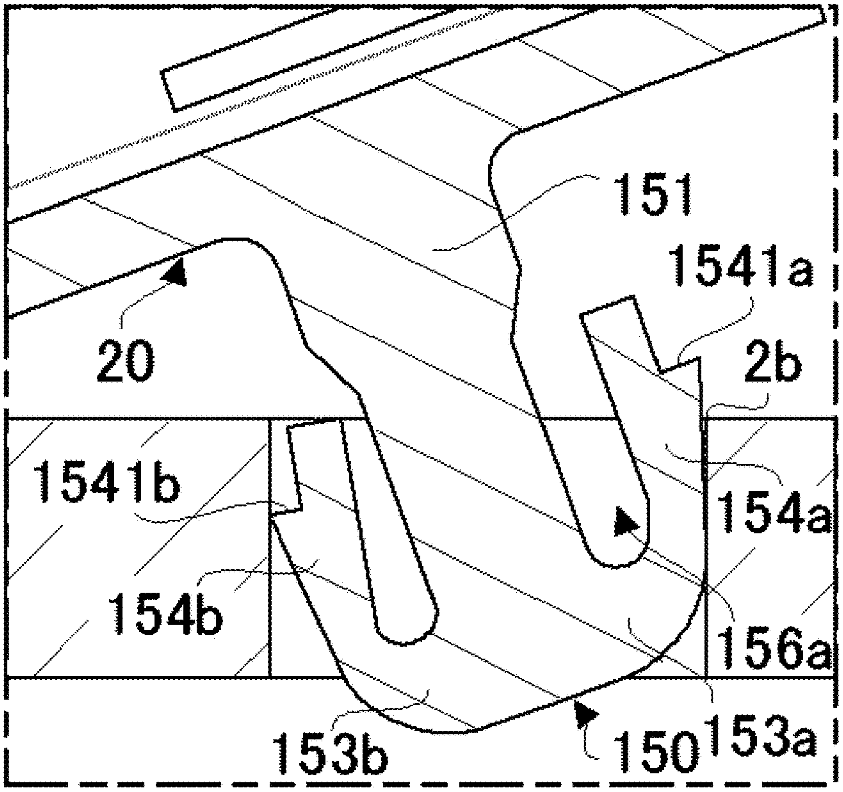

BOARD CONNECTOR

CROSS-REFERENCE TO RELATED APPLICATION

This application claims the benefit of Japanese Patent Application No. 2016-212035, filed on Oct. 28, 2016, the entire disclosure of which is incorporated by reference herein.

FIELD

This application relates to a board connector.

BACKGROUND

In one known technique for mounting a connector on a board, the housing is equipped with a projection that has a retaining engagement claw being opposed to a pin's dip part, and the retaining engagement claw is engaged with the other main surface of the board by inserting the projection into a through hole intended for the projection (see Patent Literature 1, for example).

One known technique for fastening a connector to another member employs a clip that has a pair of resilient engagement pieces at its end (see the clip in Patent Literature 2, for example). In this technique, the clip is inserted into a through hole to cause the pair of resilient engagement pieces to be engaged with an edge of the through hole.

Patent Literature 1 Unexamined Japanese Patent Application Kokai Publication No. 2000-67959

Patent Literature 2 Japanese Patent No. 3185668

SUMMARY

In the board connector described in Patent Literature 1, the retaining engagement claw is opposed to the dip part of a pin. Thus, the board connector involves a problem that, when a great upward force is acted on an end of the connector through, for example, operation of the cable, the housing is pulled toward the cable because the housing rotates around the point of support at which the pin is fastened to the board, the retaining engagement claw is less engaged with the board, and then the retaining engagement claw is released and disengaged from the board.

The connector described in Patent Literature 2 exerts the anchoring (attaching) effect when the pair of resilient engagement pieces are engaged with the board at two positions. However, the connector involves a problem that, when one of the pair of resilient engagement pieces is detached from the object to which the connector is attached, the other piece will also be disengaged.

As seen above, conventional connectors have a problem that the connector is prone to be detached from the object attached thereto, such as a board.

The present disclosure has been made in view of the foregoing circumstances, and an objective of the disclosure is to provide a board connector that is not prone to be detached from the board.

To achieve the aforementioned objective, a board connector according to the present disclosure is for attachment to a board that includes a first through hole and a second through hole, the board connector including:

an L-shaped pin terminal including an insertion inserted into the first through hole and a connecting part extending in a direction orthogonal to the insertion;

a housing disposed on one main surface of the board, the housing containing at least an end of the connecting part and having an opening into which a cable connected to the connecting part is inserted; and a J-shaped boss formed integrally with the housing, the boss passing through the second through hole and protruding from an other main surface of the board, extending in an opposite direction with respect to a direction toward the insertion, and further extending toward the board.

The boss may include:

a base contiguous to the housing and inserted into the second through hole;

a protrusion contiguous to the base and protruding from the other main surface of the board;

an inversion contiguous to the protrusion, the inversion extending in the opposite direction and being inverted toward the board; and an end contiguous to the inversion and extending toward the board, wherein a space may be formed between the protrusion and the end.

The end may be formed such that a thickness of the end in the opposite direction decreases as the end is closer to the inversion.

The boss may be disposed at an end of the housing on a side of a direction in which the connecting part extends.

A plurality of the pin terminals may be disposed to be spaced apart from one another along a direction that is orthogonal to the insertion and is orthogonal to the connecting part, and a plurality of the bosses may be disposed to be spaced apart from one another along a direction along which the pin terminals are disposed.

Owing to the above-described configurations, the board connector according to the present disclosure is not prone to be detached from a board.

BRIEF DESCRIPTION OF THE DRAWINGS

A more complete understanding of this application can be obtained when the following detailed description is considered in conjunction with the following drawings, in which:

FIG. 7A1 illustrates the state in which the board connector is attached to a board;

FIG. 7A2 is an enlarged view of the boss in FIG. 7A1;

FIG. 7B1 illustrates the state in which the end of the boss is engaged with the board;

FIG. 7B2 is an enlarged view of the boss in FIG. 7B1;

FIG. 8A1 illustrates the state in which a board connector that includes a boss with a pair of resilient engagement pieces according to a comparative example is attached to a board;

FIG. 8A2 is an enlarged view of the boss in FIG. 8A1;

FIG. 8B1 illustrates the state in which the boss according to the comparative example becomes disengaged;

FIG. 8B2 is an enlarged view of the boss in FIG. 8B1;

FIG. 9A1 illustrates the state in which the boss according to the comparative example becomes disengaged;

FIG. 9A2 is an enlarged view of the boss in FIG. 9A1;

FIG. 9B1 illustrates the state in which the boss according to the comparative example becomes disengaged; and FIG. 9B2 is an enlarged view of the boss in FIG. 9B1.

DETAILED DESCRIPTION

A board connector 1 according to an embodiment of the present disclosure will now be described with reference to FIGS. 1 to 7. For ease of understanding, an XYZ orthogonal coordinate system is applied to the drawings and referred to as appropriate, where the −Z-axis direction corresponds to the direction in which an insertion 11 of a below-described pin terminal 10 extends, while the +Y-axis direction corresponds to the direction in which a conductor swaging part 12 of the pin terminal 10 extends.

Figure 1:
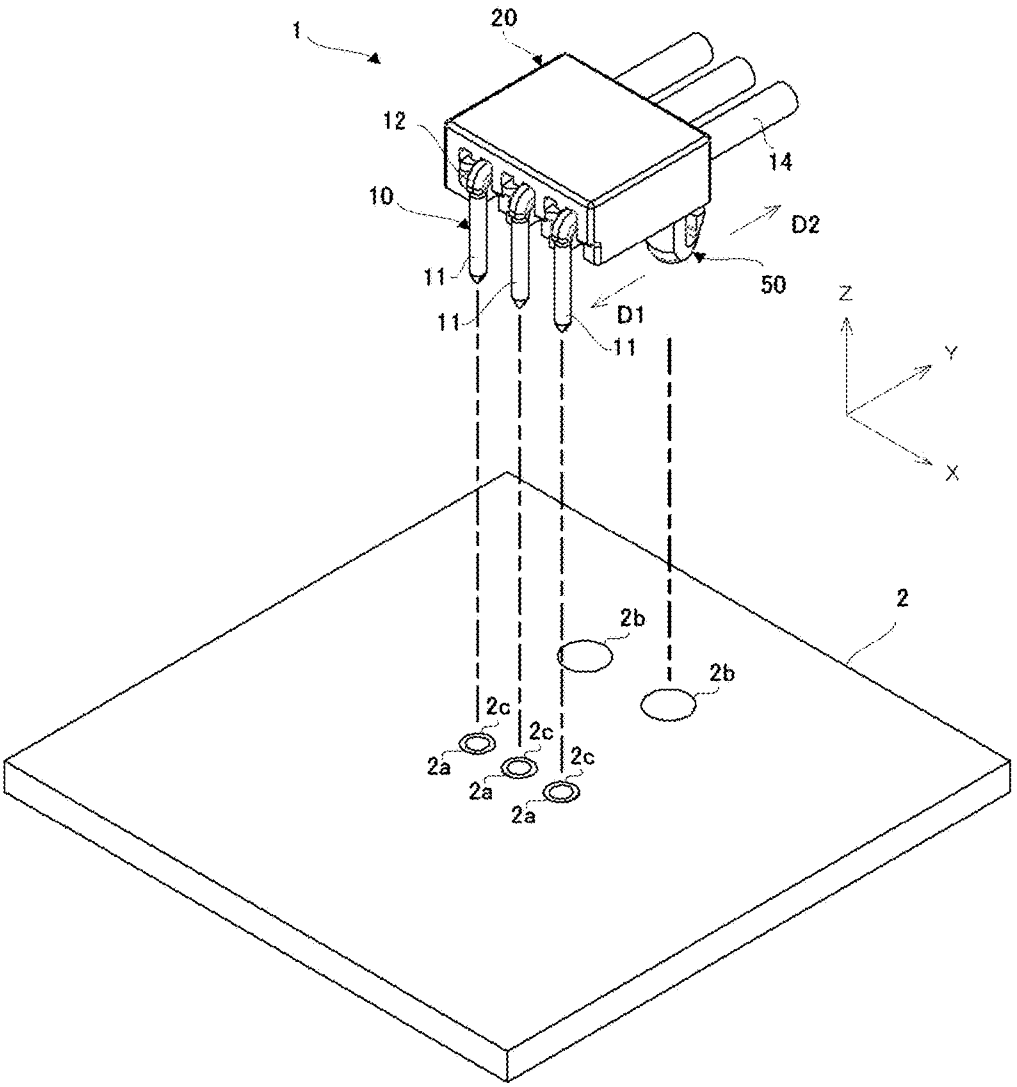
FIG. 1 is a perspective view of a board connector according to an embodiment of the present disclosure.

As illustrated in FIG. 1, the board connector 1 is mounted on one main surface (the surface on the +Z side) of a printed board 2 placed on an XY plane. The board connector 1 includes a pin terminal 10, a housing 20, and a boss 50.

Figure 2:
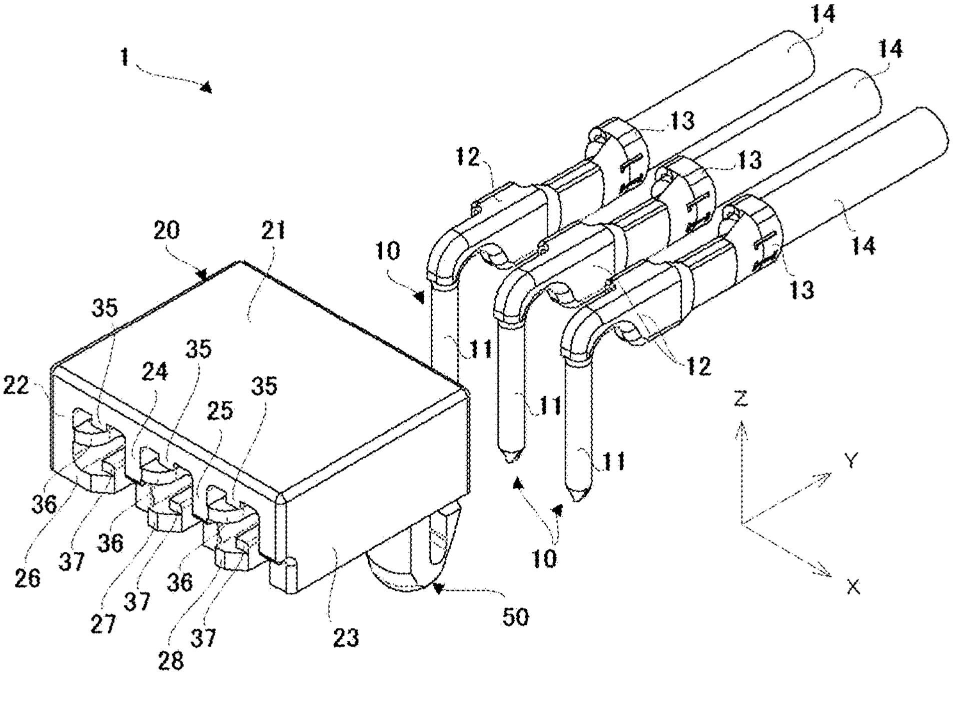
FIG. 2 is an exploded perspective view of the board connector in FIG. 1.

As seen in FIG. 2, the pin terminal 10 is formed by bending a conductor, such as an electrically conductive plate material made from copper, aluminum, or the like. As illustrated in FIG. 2, the pin terminal 10, which is formed into an L shape, includes the insertion 11 extending in the −Z-axis direction and the conductor swaging part (connecting part) 12 extending in the +Y-axis direction. The conductor swaging part 12 of the pin terminal 10 is electrically connected, via an insulator swaging part 13, to a core wire conductor of a cable 14.

The insulator swaging part 13, which is formed of a member integral with the pin terminal 10, is coupled to the insertion 11 via the conductor swaging part 12 of the pin terminal 10. The insulator swaging part 13 is also coupled to an end of the cable 14, the end being an exposed core wire conductor with its insulator removed. As a result, the pin terminal 10 is fastened and electrically connected to the core wire conductor of the cable 14.

The housing 20 is formed from a polymeric resin, which is an insulating material, into a rectangular cuboid, and houses and protects the pin terminal 10, the insulator swaging part 13, and an end of the cable 14. The housing 20 includes a top plate 21, two side walls 22 and 23, and two partition walls 24 and 25. The side wall 22 is disposed lateral to the top plate 21 on the side of the −X-axis direction. The side wall 23 is disposed lateral to the top plate 21 on the side of the +X-axis direction. The two partition walls 24 and 25 are placed between the two side walls 22 and 23 to divide the space between the two side walls 22 and 23 into three regions in the X-axis direction.

Figure 3:
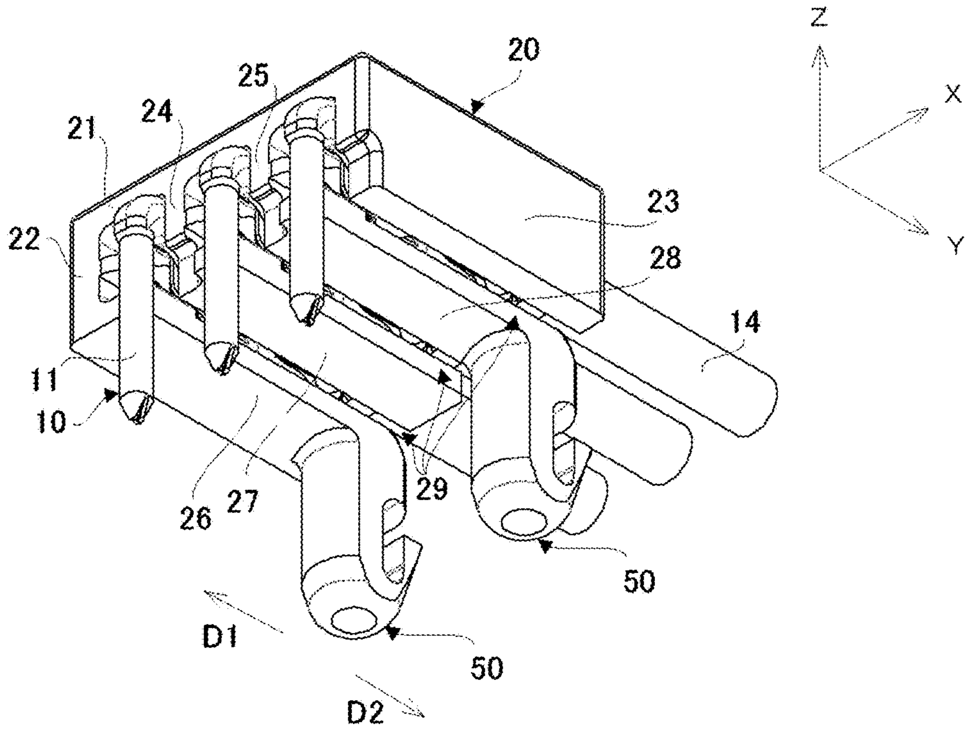
FIG. 3 is a perspective view of the board connector in FIG. 1 seen from the underside.

In addition, as illustrated in FIG. 3, the housing 20 includes a bottom plate 26 extending from the bottom (the end on the side of the −Z-axis direction) of the side wall 22 in the +X-axis direction, a bottom plate 27 extending from the bottom of the partition wall 24 in the +X-axis direction, and a bottom plate 28 extending from the bottom of the partition wall 25 in the +X-axis direction. A slit 29 is formed in each of the spaces between the bottom plate 26 and the partition wall 24, the bottom plate 27 and the partition wall 25, and the bottom plate 28 and the side wall 23. The slit 29 is wide enough for the insertion 11 of the pin terminal 10 to pass through during assembly, but is not wide enough for the conductor swaging part 12 to pass through.

Figure 4:
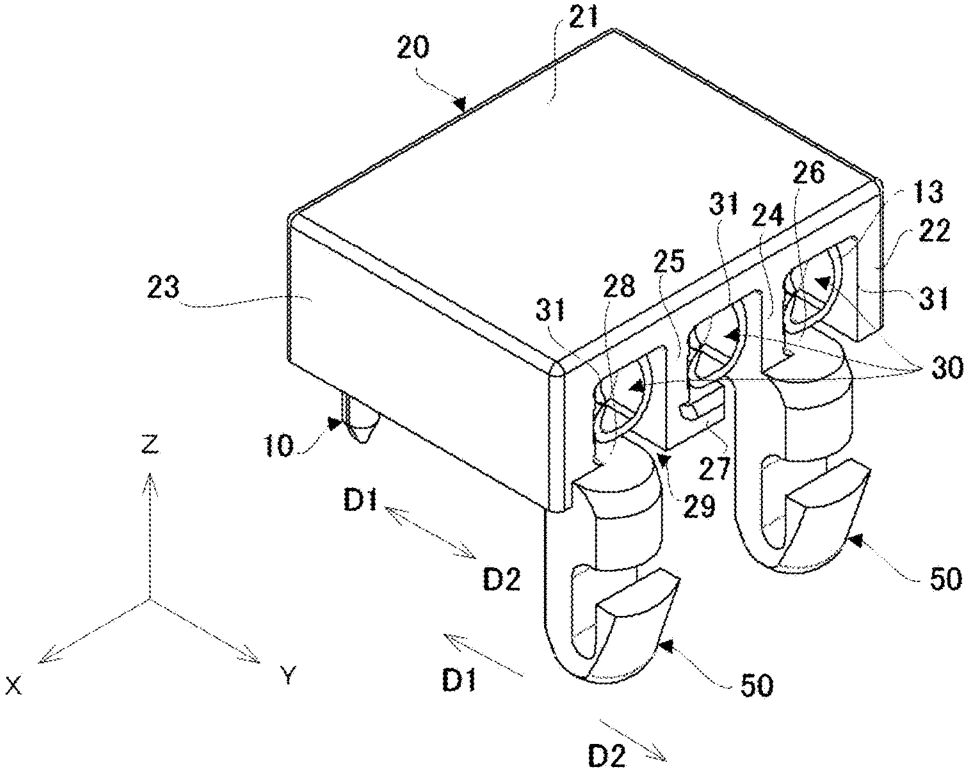
FIG. 4 is a perspective view of a housing.

As illustrated in FIG. 4, a housing region 30 is formed in each of the following regions: the region enclosed with the top plate 21, the side wall 22, the bottom plate 26, and the partition wall 24, the region enclosed with the top plate 21, the partition wall 24, the bottom plate 27, and the partition wall 25, and the region enclosed with the top plate 21, the partition wall 25, the bottom plate 28, and the side wall 23. Each housing region 30 contains the insulator swaging part 13, an end of the cable 14, and an end of the conductor swaging part 12. The housing 20 includes, at its end on the side of the +Y-axis direction, an opening 31 leading to the housing region 30.

As illustrated in FIG. 2, the housing 20 includes, at its end on the side of the −Y-axis direction, a stopper 35, a lance 36, and a stopper 37, which are used for retaining the conductor swaging part 12 and the insulator swaging part 13 of the pin terminal 10 within the housing region 30. The stopper 35 is formed integrally with the top plate 21, and protrudes in the −Z-axis direction. The stopper 35 serves as a stopper when the pin terminal 10 is inserted into the housing 20. The lance 36 is formed integrally with the side wall 22 or the partition wall 24 or 25, and extends in the +Y-axis direction. The lance 36 retains the pin terminal 10 with a pressing force by pressing the pin terminal 10 that has been inserted into the housing 20, so that the pin terminal 10 is prevented from coming off the housing 20. The stopper 37 is formed integrally with the bottom plate 26, 27, or 28, and protrudes in the +Z-axis direction. Along with the stopper 35, the stopper 37 serves as a stopper when the pin terminal 10 is inserted into the housing 20. As illustrated in FIG. 2, the pin terminal 10, the insulator swaging part 13, and the cable 14, which are linked together, are inserted into the opening 31 in the housing 20 (see FIG. 4). In this step, the insertion 11 of the pin terminal 10 is passed through the slit 29, and at the same time the insulator swaging part 13 is inserted into the housing region 30 (see FIG. 3). The conductor swaging part 12 is retained by the lance 36. Then, as depicted in FIG. 3, the insulator swaging part 13, an end of the cable 14, and an end of the conductor swaging part 12 are housed within the housing region 30. When every housing region 30 contains the insulator swaging part 13, three pin terminals 10 are now arranged to be spaced apart from one another along the X-axis direction, which is orthogonal to the insertion 11 and to the conductor swaging part 12.

Figure 5:
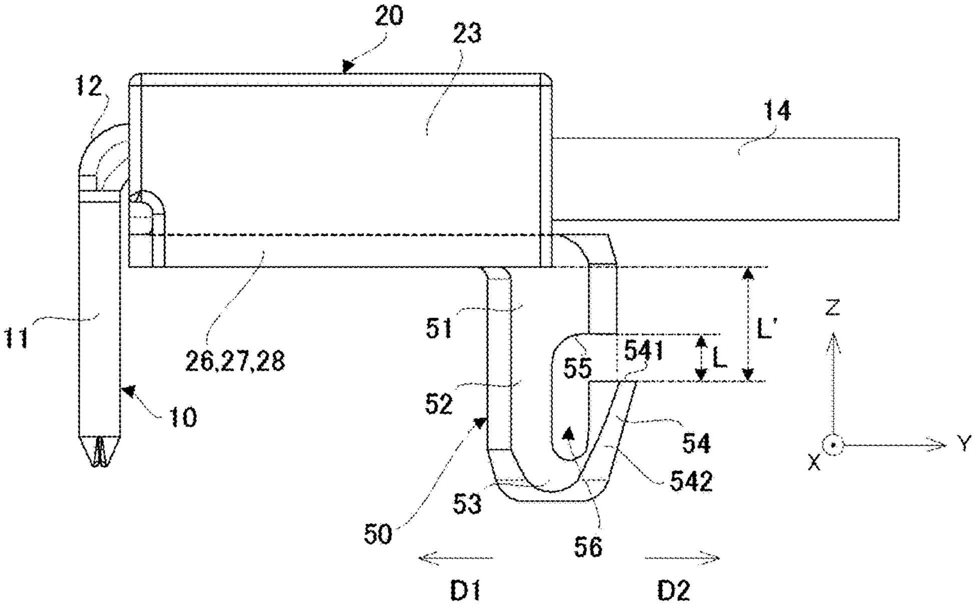
FIG. 5 is a side view of the board connector in FIG. 1.

As illustrated in FIGS. 3 and 4, a boss 50, which is formed integrally with the housing 20, is placed at an end of the housing 20 on the side of the +Y-axis direction. Two bosses 50 are arranged to be spaced apart from one another along the X-axis direction. As depicted in FIG. 5, the boss 50 is formed into a J shape and includes a base 51, a protrusion 52, an inversion 53, and an end 54.

The base 51 is contiguous to the bottom plate 26 or 28 of the housing 20 and extends in the −Z-axis direction. The protrusion 52 is contiguous to the base 51 and extends in the −Z-axis direction. The base 51 and the protrusion 52 are formed so that their lateral faces on the side of the −Y-axis direction are flush with each other. The protrusion 52 is made smaller than the base 51 in the dimension in the +Y-axis direction, creating a step 55 between the lateral faces of the base 51 and protrusion 52 on the side of the +Y-axis direction.

The inversion 53 is contiguous to the protrusion 52, extends in a direction D2 opposite to the direction D1 toward the insertion 11, and is inverted toward the +Z-axis direction. Note that the direction D1 is the same as the −Y direction while the opposite direction D2 is the same as the +Y direction. The end 54 is contiguous to the inversion 53 and extends in the +Z-axis direction. A space 56 is formed between the protrusion 52 and the end 54. The inversion 53 and the end 54 are formed to protrude in the +Y-axis direction relative to the lateral face of the housing 20 on the side of the +Y-axis direction.

The end 54 includes a flat face 541 orthogonal to the Z axis. The flat face 541 is formed so that the distance L between the flat face 541 and the step 55 of the base 51 is slightly smaller than the thickness of the printed board 2. This brings an advantage that, for example, when the board connector 1 is mounted on the printed board 2, the base 51 is smoothly inserted into the through hole 2*b* in the printed board 2 (see FIG. 1) without any part of the printed board 2 caught between the flat face 541 and the step 55 of the base 51.

In addition, the flat face 541 is disposed so that the distance L' between the flat face 541 and the bottom plate 26, 27, or 28 (the face on the −Z side) of the housing 20, that is, the distance L' between the flat face 541 and the bottom face of the printed board 2, is slightly larger than the thickness of the printed board 2.

A portion of the end 54 adjacent to the inversion 53 forms a resilient deforming part 542, which can resiliently deform. The end 54 is formed so that its thickness in the +Y-axis direction decreases as the end 54 extends in the −Z-axis direction, or in other words, as the end 54 is closer to the inversion 53. The lateral face of the end 54 on the side of the +Y-axis direction is sloped toward the −Y-axis direction as the end 54 extends in the −Z-axis direction. Thus, when the boss 50 is inserted into the through hole 2*b* in the printed board 2, the end 54 can lean in a direction closer to the protrusion 52 (the −Y-axis direction) starting from around the resilient deforming part 542.

As illustrated in FIG. 1, the printed board 2 includes a through hole (first through hole) 2*a* and a through hole (second through hole) 2*b*. The through hole 2*a*, into which the insertion 11 of the pin terminal 10 is to be inserted, has a diameter that allows the insertion 11 of the pin terminal 10 to be inserted. A conductor pattern 2*c* is formed on the perimeter of the through hole 2*a*. Three through holes 2*a* are arranged along the X-axis direction with the same pitches as those for the pin terminals 10 so that the insertions 11 of all the pin terminals 10 can be inserted.

The through hole 2*b*, into which the boss 50 is to be inserted, has a diameter slightly larger than the base 51 of the boss 50 allowing the base 51 to be inserted. Two through holes 2*b* are arranged along the X-axis direction, spaced apart by the same distance as that between bosses 50.

The distance along the Y-axis direction between the centers of the through holes 2*a* and 2*b* is approximately the same as the distance along the Y-axis direction between the centers of the insertion 11 of the pin terminal 10 and the boss 50.

How the board connector 1 is attached to the printed board 2 will now be described.

In the first place, as illustrated in FIG. 2, the conductor swaging part 12 of the pin terminal 10 is connected to an end of the conductor of the cable 14 through the insulator swaging part 13. Next, the cable 14 with the pin terminal 10 placed in front is inserted into the opening 31 in the housing 20 (see FIG. 4). In this step, the insertion 11 of the pin terminal 10 is passed through the slit 29, and at the same time the insulator swaging part 13 is inserted into the housing region 30. When completely inserted, the conductor swaging part 12 is retained by the lance 36, and, as depicted in FIG. 3, the insulator swaging part 13, an end of the cable 14, and an end of the conductor swaging part 12 are housed within the housing region 30.

Figure 6A:
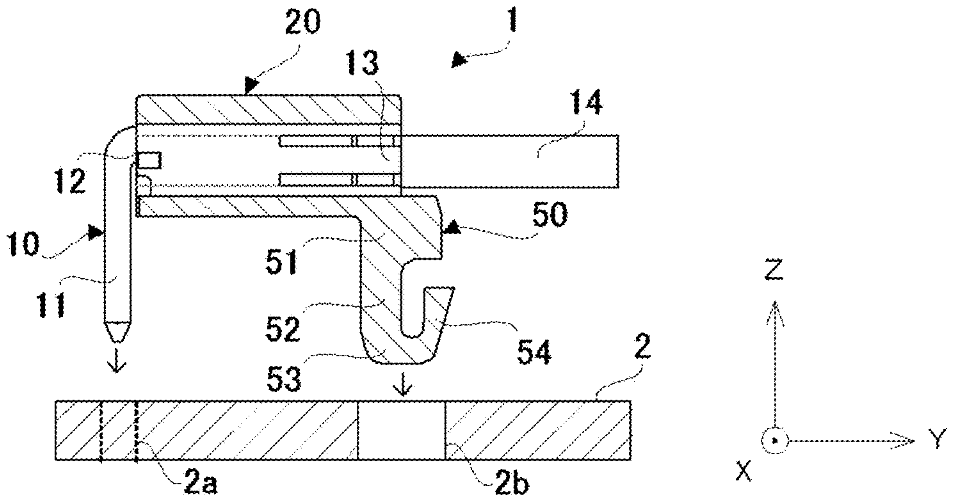
FIG. 6A is a diagram intended to explain attaching the board connector to a board.
Figure 6B:
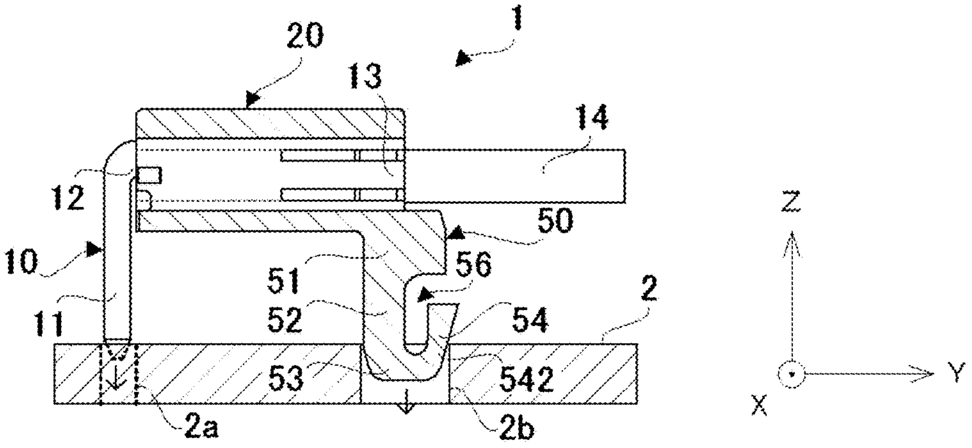
FIG. 6B is a diagram intended to explain attaching the board connector to a board.
Figure 6C:
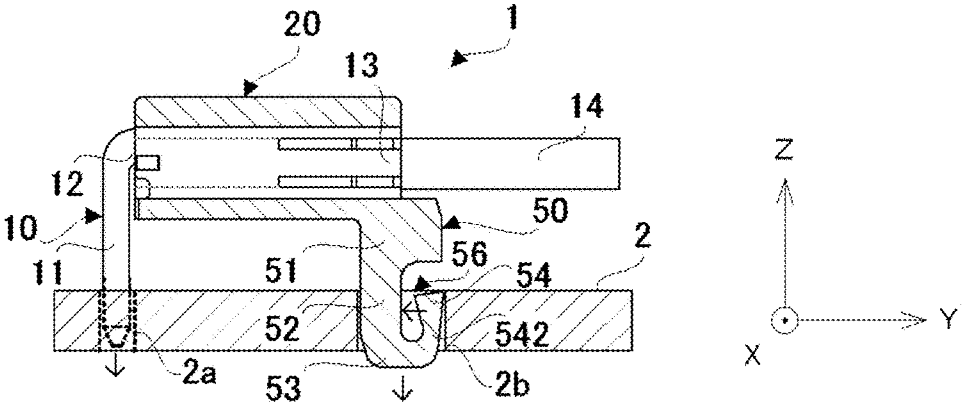
FIG. 6C is a diagram intended to explain attaching the board connector to a board.
Figure 6D:
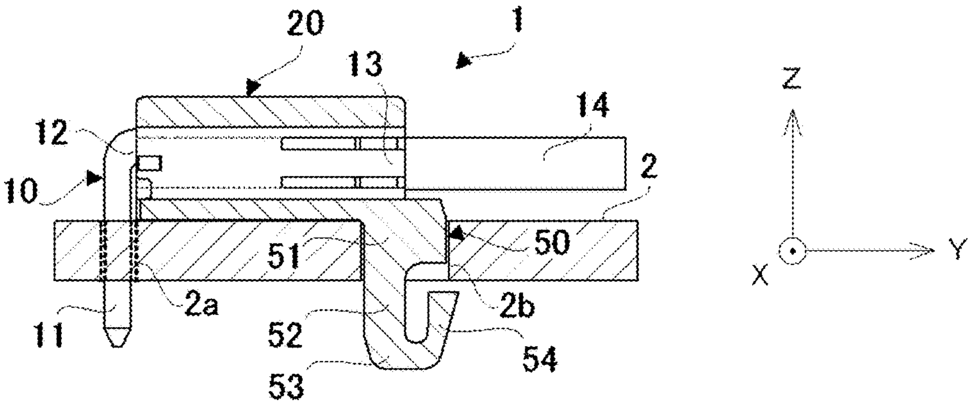
FIG. 6D is a diagram intended to explain attaching the board connector to a board.

Next, as illustrated in FIG. 6A, the insertion 11 of the pin terminal 10 is inserted into the through hole 2*a* in the printed board 2, while the boss 50 is inserted into the through hole 2*b* in the printed board 2. During this step, as illustrated in FIG. 6B, the end 54 of the boss 50 comes to abut on an edge of the through hole 2*b*. It should be noted that the end 54 includes the resilient deforming part 542, and there is a space 56 between the protrusion 52 and the end 54. Thus, the end 54 leans in a direction closer to the protrusion 52 as seen in FIG. 6C. Then, when the end 54 comes out of the through hole 2*b*, the end 54 returns to its original posture as depicted in FIG. 6D.

Subsequently, the insertion 11 and the conductor pattern 2*c* formed on the perimeter of the through hole 2*a* are soldered, and the insertion 11 of the pin terminal 10 is connected to a circuit formed on the printed board 2.

The board connector 1 in this state, which is illustrated in FIGS. 7A1 and 7A2, is fastened to the printed board 2 with the soldered insertion 11 and the boss 50.

At this point of time, if a force is acted in the +Z-axis direction on an end of the housing 20 on the side of the +Y-axis direction due to, for example, lifting up the cable 14, the housing 20 rotates in the direction indicated by an arrow K in FIG. 7B1 around the point at which the pin terminal 10 is fastened to the printed board 2 or the point at which the pin terminal 10 is bent, the point serving as a point of support. Then, as illustrated in FIGS. 7B1 and 7B2, the flat face 541 of the end 54 abuts on the other main surface of the printed board 2, and the boss 50 is retained on the other main surface of the printed board 2. As a result, the housing 20 stops rotating. If a force is further acted on the housing 20 in the +Z-axis direction, the rotation of the housing 20 is restricted because the end 54 abuts on the printed board 2. At this point of time, a force is acted on the end 54 of the boss 50 in the +Y-axis direction. Even when the end 54 moves in the +Y-axis direction caused by the force acted in the +Y-axis direction, the end 54 is not detached from the printed board 2.

Therefore, the board connector 1 is not detached from the printed board 2 irrespective of a force applied to the board connector 1 in the +Z-axis direction.

For the purpose of making a comparison with the board connector 1 according to the present embodiment, the following describes a comparative example referring to FIGS. 8 and 9, in which a board connector 100 is equipped with a boss that includes a pair of resilient engagement pieces like the boss described in Patent Literature 2. For ease of understanding, an XYZ orthogonal coordinate system is applied to the drawings and referred to as appropriate, as in FIGS. 1 to 7. Note that the board connector 100 includes a pin terminal 10 and a housing 20 that are configured in the same manner as in the board connector 1.

As illustrated in FIGS. 8A1 and 8A2, the board connector 100 is equipped with a boss 150 that includes a pair of resilient engagement pieces. The boss 150 is formed integrally with the housing 20 and is placed at a center of the housing 20 with respect to the Y-axis direction. As depicted in FIG. 8A2, the boss 150 includes a base 151, a protrusion 152, inversions 153*a* and 153*b*, and ends 154*a* and 154*b*.

The inversion 153*a* and the end 154*a* with the inversion 153*b* and the end 154*b* together form a pair of resilient engagement pieces.

The base 151 is contiguous to the bottom plate 26 or 28 of the housing 20 and extends in the −Z-axis direction. The protrusion 152 is contiguous to the base 151 and extends in the −Z-axis direction. The dimension of the protrusion 152 along the Y-axis direction is made smaller than the dimension of the base 151 along the Y-axis direction, and thus a step 155*a* is formed between the lateral faces of the base 151 and the protrusion 152 on the side of the +Y-axis direction, while a step 155*b* is created between the lateral faces of the base 151 and the protrusion 152 on the side of the −Y-axis direction.

The inversion 153*a* is contiguous to the protrusion 152, extends in the +Y-axis direction, and is inverted toward the +Z-axis direction. The end 154*a* is contiguous to the inversion 153*a* and extends in the +Z-axis direction. A space 156*a* is formed between the protrusion 152 and the end 154*a*. The inversion 153*b* is contiguous to the protrusion 152, extends in the −Y-axis direction, and is inverted toward to the +Z-axis direction. The end 154*b* is contiguous to the inversion 153*b* and extends in the +Z-axis direction. A space 156*b* is formed between the protrusion 152 and the end 154*b*.

The ends 154*a* and 154*b* include flat faces 1541*a* and 1541*b*, respectively, orthogonal to the Z-axis (and parallel to an XY plane). Each of the ends 154*a* and 154*b* is formed so that its thickness in the +Y-axis direction decreases as the end extends in the −Z-axis direction, or in other words, as the end is closer to the inversion 153*a* or 153*b*. Portions of the ends 154*a* and 154*b* adjacent to the inversions 153*a* and 153*b* form resilient deforming parts 1542*a* and 1542*b*, respectively, which can resiliently deform. Thus, the end 154*a* can lean in a direction closer to the protrusion 152 (the −Y-axis direction) starting from around the resilient deforming part 1542*a*. Likewise, when the boss 150 is inserted into the through hole 2*b* in the printed board 2, the end 154*b* can lean in a direction closer to the protrusion 152 (the +Y-axis direction) starting from around the resilient deforming part 1542*b*.

In addition, the ends 154*a* and 154*b* include restricting parts 1543*a* and 1543*b* extending from the flat faces 1541*a* and 1541*b*, respectively, in the +Z-axis direction. When the restricting part 1543*a* abuts on an inner wall of the through hole 2*b*, the movement of the end 154*a* in the +Y-axis direction is restricted. Likewise, when the restricting part 1543*b* abuts on an inner wall of the through hole 2*b*, the movement of the end 154*b* in the −Y-axis direction is restricted.

As illustrated in FIGS. 8A1 and 8A2, when the board connector 100 has been mounted on the printed board 2, the base 151 of the boss 150 is inserted into the through hole 2*b* while the ends 154*a* and 154*b* extend toward the printed board 2.

When a force is acted in the +Z-axis direction on an end of the housing 20 on the side of the +Y-axis direction due to, for example, lifting up the cable 14, the housing 20 rotates in the direction indicated by the arrow K in FIG. 8B1. Subsequently, the flat faces 1541*a* and 1541*b* of the ends 154*a* and 154*b* abut on the flat face of the printed board 2 on the −Z side, which causes the boss 150 to be engaged with the printed board 2, and then the housing 20 and the boss 150 stop rotating.

When a force is further acted on the housing 20 in the +Z-axis direction, the restricting part 1543*b* abuts on an inner wall of the through hole 2*b*, and the movement of the end 154*b* in the −Y-axis direction is restricted, and at the same time the protrusion 152 comes closer to the end 154*b*. As the protrusion 152 comes closer to the end 154*b*, the end 154*a* moves in the −Y-axis direction, and the end 154*a* is released from the printed board 2 as illustrated in FIG. 8B2. Then, the housing 20 rotates in the direction indicated by the arrow K in FIG. 9A1, the flat face 1541*b* of the end 154*b* of the boss 150 is tilted as seen in FIG. 9A2, and the end 154*b* is displaced in the +Y-axis direction and becomes released from the printed board 2 as shown in FIGS. 9B1 and 9B2.

As seen above, in the board connector 100 equipped with the boss 150 according to the comparative example, once the end 154*a* is released from the printed board 2, the end 154*b* also becomes released from the printed board 2, causing the boss 150 to be disengaged from the printed board 2.

In addition, as described above, the boss 150 is placed at a center of the housing 20 with respect to the Y-axis direction. Thus, when the cable 14 is lifted up, an end of the housing 20 on the side of the +Y-axis direction serves as a point of effort, while a portion in which the pin terminal 10 is fastened to the printed board 2 or in which the pin terminal is bent serves as a point of support, and the base of the boss 150 serves as a point of application. Hence, a force greater than that acted on the end of the housing 20 on the side of the +Y-axis direction is applied to the boss 150. Therefore, even when a small force is acted on the housing 20, the ends 154*a* and 154*b* may be released from the printed board 2, causing the boss 150 to be disengaged from the printed board 2.

Accordingly, it is again understood that the board connector 1 of the present embodiment is not prone to be detached from the printed board 2.

As described above, the board connector 1 according to the present embodiment includes: the pin terminal 10 that is formed into an L shape and includes the insertion 11 to be inserted into the through hole 2*a* in the printed board 2 and the conductor swaging part 12 extending in a direction (+Y-axis direction) orthogonal to the insertion 11; and the housing 20 that includes the opening 31 which houses at least an end of the conductor swaging part 12 and into which the cable 14 connected to the conductor swaging part 12 is inserted, wherein the housing 20 is to be placed on one main surface of the printed board 2. The board connector 1 further includes the boss 50 that is in a J shape and is formed integrally with the housing 20, the boss 50 passing through the through hole 2*b* in the printed board 2 and protruding from the other main surface of the printed board 2, extending in the direction D2 (+Y-axis direction) opposite to the direction D1 toward the insertion 11, and further extending toward the printed board 2. As a result, the boss 50 is prevented from being disengaged from the printed board 2 when a force is acted on the housing 20 in the +Z-axis direction caused by, for example, operating or vibrating the cable 14 by accident.

In the board connector 1 according to an embodiment of the present disclosure, the boss 50 includes: the base 51 that is contiguous to the housing 20 and is inserted into the through hole 2*b* in the printed board 2; the protrusion 52 that is contiguous to the base 51 and protrudes from the other main surface of the printed board 2, the inversion 53 that is contiguous to the protrusion 52, extends in the direction D2 (+Y-axis direction) opposite to the direction D1 toward the insertion 11, and is inverted toward the printed board 2; and the end 54 that is contiguous to the inversion 53 and extends toward the printed board 2. The space 56 is formed between the protrusion 52 and the end 54. As a result, when a force is acted on the housing 20 in the +Z-axis direction, the end 54 abuts on the other main surface of the printed board 2, and thus the boss 50 is prevented from being disengaged from the printed board 2.

In the board connector 1 according to an embodiment of the present disclosure, the end 54 is formed so that its thickness in the direction D2 (+Y-axis direction) opposite to the direction D1 toward the insertion 11 decreases as the end 54 is closer to the inversion 53. Thus, a portion of the end 54 adjacent to the inversion 53 forms the resilient deforming part 542. As a result, when the boss 50 is inserted into the through hole 2*b* in the printed board 2, the end 54 leans in a direction closer to the protrusion 52, without creating an obstruction for the boss 50 to be inserted into the through hole 2*b* in the printed board 2.

In the board connector 1 according to an embodiment of the present disclosure, the boss 50 is placed at an end of the housing 20 on the side of the direction D2 (+Y-axis direction) opposite to the direction D1 toward the insertion 11. As a result, when a force is acted in the +Z-axis direction on an end of the housing 20 on the side of the +Y-axis direction, any greater force is prevented from acting on the boss 50.

In the board connector 1 according to an embodiment of the present disclosure, pin terminals 10 are arranged to be spaced apart from one another along a direction (the X-axis direction) orthogonal to insertions 11 and to conductor swaging parts 12. Bosses 50 are arranged to be spaced apart from one another along the direction (the X-axis direction) in which the pin terminals 10 are arranged. As a result, irrespective of whether the housing 20 is formed into a rectangular cuboid whose size along the X-axis direction is larger than its size along the Y-axis direction, the bosses 50 are prevented from being disengaged from the printed board 2.

Embodiments of the present disclosure have been described above, but the present disclosure is not limited to the foregoing embodiments.

In the foregoing embodiments, the pin terminal 10 is L-shaped including the insertion 11 and the conductor swaging part 12. However, the pin terminal 10 may be configured in any way as long as the cable 14 can be connected to a circuit pattern on the board.

In the foregoing embodiments, the pin terminal 10 and the insulator swaging part 13 are described as being integrated with each other into a connecting terminal having a pin. However, the present disclosure is not limited to this. For example, the pin terminal 10 and the insulator swaging part 13 may be different members.

In the foregoing embodiments, the pin terminal 10, the insulator swaging part 13, and the cable 14 are linked together, and the cable 14 with the pin terminal 10 placed in front is inserted into the opening 31 in the housing 20. However, the present disclosure is not limited to this configuration. For example, the housing 20 may include a side wall on a lateral part of the top plate 21 on the side of the −Y-axis direction, and the conductor swaging part 12 of the pin terminal 10 may be passed through and retained on the side wall. Then, the cable 14 coupled to a connecting terminal, which is to be fitted to the conductor swaging part 12, may be inserted into the opening 31, and the connecting terminal may be fitted to the conductor swaging part 12, so that electrical connection is established between the pin terminal 10 and a core wire conductor of the cable 14.

The housing 20 may be configured in any way as long as the housing 20 can house and support a connection among the pin terminal 10, the insulator swaging part 13, and the cable 14.

In the foregoing embodiments, the boss 50 includes the base 51, the protrusion 52, the inversion 53, and the end 54 as illustrated in FIG. 5. However, the present disclosure is not limited to this configuration. The boss 50 need only form a J shape passing through the through hole 2*b*, protruding from the other main surface of the printed board 2, extending in a direction (+Y-axis direction) opposite to the direction toward the insertion 11, and further extending toward the printed board 2. For example, the boss 50 may extend in the −Z-axis direction, and then bend at a right angle toward the +Y-axis direction to extend in the +Y-axis direction, and further bend at a right angle toward the +Z-axis direction to extend in the +Z-axis direction. Such shape of the boss 50 is also referred to as J-shaped.

The foregoing example shows that the end 54 includes the flat face 541 parallel to an XY plane. However, the flat face may be in any shape as long as it can be engaged with the printed board 2 when subjected to an external force. For example, the flat face 541 may not necessarily be parallel to an XY plane. Alternatively, the end 54 may include a non-flat face instead of the flat face 541.

In the foregoing embodiments, three pin terminals 10 are arranged along the X-axis direction while two bosses 50 are arranged along the X-axis direction. However, the present disclosure is not limited to these numbers, and any number of pin terminals 10 and any number of bosses 50 may be arranged. For example, the number of pin terminals 10 may be two or four or more while the number of bosses 50 may be three or more. The number of pin terminals 10 may or may not be the same as the number of bosses 50. Only one pin terminal 10 and only one boss 50 may be disposed. Alternatively, a plurality of pin terminals 10 and one boss 50 may be disposed, or one pin terminal 10 and a plurality of bosses 50 may be disposed.

Furthermore, the above-described materials, shapes, and sizes are example only, and are not meant to be restrictive.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

What is claimed is:

1. A board connector for attachment to a board that includes a first through hole and a second through hole, the board connector comprising:

an L-shaped pin terminal comprising an insertion inserted into the first through hole and a connecting part extending in a direction orthogonal to the insertion;

a housing disposed on one main surface of the board, the housing containing at least an end of the connecting part and having an opening into which a cable connected to the connecting part is inserted; and a J-shaped boss formed integrally with the housing, the boss passing through the second through hole and protruding from an other main surface of the board, extending from an end of the housing that is apart from the pin terminal and in a direction opposite to the direction toward the insertion, and further extending toward the board wherein the boss comprises:

a base contiguous to the housing and inserted into the second through hole;

a protrusion contiguous to the base and protruding from the other main surface of the board;

an inversion contiguous to the protrusion, the inversion extending in the direction opposite to the direction toward the pin terminal and being inverted toward the board; and an end contiguous to the inversion and extending toward the board, a space is formed between the protrusion and the end, and the inversion and the end protrude from an end of the housing that is apart from the pin terminal and in a direction opposite to the direction toward the pin terminal (+Y direction).

2. The board connector according to claim 1, wherein the end is formed such that a thickness of the end in the opposite direction decreases as the end is closer to the inversion.

3. The board connector according to claim 1, wherein the boss is disposed at an end of the housing on a side of a direction in which the connecting part extends.

4. The board connector according to claim 1, wherein a plurality of the pin terminals are disposed to be spaced apart from one another along a direction that is orthogonal to the insertion and is orthogonal to the connecting part, and wherein a plurality of the bosses are disposed to be spaced apart from one another along a direction along which the pin terminals are disposed.

5. The board connector according to claim 1, wherein a cross-sectional area of the base is approximately equal to an area of the second through hole.

6. The board connector according to claim 1, wherein the boss is further configured to define a gap between the end and the board when the connector is fully inserted.

* * * * *